(12) United States Patent
Iosad et al.

(10) Patent No.: US 8,982,318 B2
(45) Date of Patent: Mar. 17, 2015

(54) LITHOGRAPHIC APPARATUS AND METHOD

(75) Inventors: Nikolay Nikolaevich Iosad, Geldrop (NL); Cheng-Qun Gui, Best (NL)

(73) Assignee: ASML Netherlands B.V., Veldhoven (NL)

( * ) Notice: Subject to any disclaimer, the term of this patent is extended or adjusted under 35 U.S.C. 154(b) by 724 days.

(21) Appl. No.: 12/566,073

(22) Filed: Sep. 24, 2009

(65) Prior Publication Data

US 2010/0081072 A1 Apr. 1, 2010

Related U.S. Application Data

(60) Provisional application No. 61/136,703, filed on Sep. 26, 2008.

(51) Int. Cl.
*G03F 7/20* (2006.01)

(52) U.S. Cl.
CPC ........ *G03F 7/70291* (2013.01); *G03F 7/70508* (2013.01)
USPC ................... 355/52; 355/53; 355/55; 355/67; 355/70; 355/77

(58) Field of Classification Search
USPC ................. 355/52, 53, 54, 55, 56, 67–71, 77; 250/492.1, 492.2, 492.22, 548; 430/8, 430/22, 30, 311, 312, 315, 322
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,523,193 A | 6/1996 | Nelson | |
| 6,312,134 B1 * | 11/2001 | Jain et al. | 359/855 |
| 6,428,940 B1 * | 8/2002 | Sandstrom | 430/22 |
| 6,873,938 B1 * | 3/2005 | Paxton et al. | 702/188 |
| 6,963,434 B1 * | 11/2005 | Latypov | 359/237 |

(Continued)

FOREIGN PATENT DOCUMENTS

| | | |
|---|---|---|
| JP | 2002-174890 | 6/2002 |
| JP | 2002-175969 | 6/2002 |

(Continued)

OTHER PUBLICATIONS

Korean Office Action dated Mar. 23, 2011 in corresponding Korean Patent Application No. 10-2009-0091095.

(Continued)

*Primary Examiner* — Christina Riddle
(74) *Attorney, Agent, or Firm* — Pillsbury Winthrop Shaw Pittman LLP

(57) ABSTRACT

A lithographic method, among things is disclosed. The method includes using information at least indicative of a desired shape or size of a constituent part of a device to implement the desired shape or size of the constituent part of the device, the desired shape or size being related to a measured property of a layer of material in which the constituent part of the device is to be created, at least a part of the implementation comprising determining a configuration of a plurality of individually controllable elements that would be necessary to create in a radiation beam a pattern which is sufficient to implement the desired shape or size of the constituent part of the device when creating the constituent part of the device.

20 Claims, 6 Drawing Sheets

(56) References Cited

U.S. PATENT DOCUMENTS

| | | |
|---|---|---|
| 7,016,015 B2 | 3/2006 | Bleeker |
| 7,133,118 B2 | 11/2006 | Gui et al. |
| 7,259,829 B2 | 8/2007 | Bleeker et al. |
| 7,326,522 B2 | 2/2008 | Dierichs |
| 7,327,439 B2 | 2/2008 | Zaal et al. |
| 7,385,677 B2 | 6/2008 | Bleeker |
| 7,894,041 B2 | 2/2011 | Bleeker |
| 2002/0072001 A1* | 6/2002 | Brown et al. .............. 430/30 |
| 2004/0165164 A1* | 8/2004 | Raebiger et al. .............. 355/53 |
| 2005/0075819 A1* | 4/2005 | Paxton et al. .............. 702/117 |
| 2005/0128450 A1* | 6/2005 | Schroeder .............. 355/53 |
| 2005/0168790 A1* | 8/2005 | Latypov et al. .............. 359/239 |
| 2005/0179882 A1 | 8/2005 | Gui et al. |
| 2006/0017903 A1* | 1/2006 | Bleeker et al. .............. 355/67 |
| 2006/0215142 A1* | 9/2006 | De Jager et al. .............. 355/69 |

FOREIGN PATENT DOCUMENTS

| | | |
|---|---|---|
| JP | 2006-054451 | 2/2006 |
| JP | 2007-310263 | 11/2007 |
| KR | 2004-0111155 | 12/2004 |
| KR | 2006-0042073 | 5/2006 |
| WO | WO 98/33096 A1 | 7/1998 |
| WO | WO 98/38597 A2 | 9/1998 |

OTHER PUBLICATIONS

Taiwan Office Action dated Apr. 26, 2013 in corresponding Taiwan Patent Application No. 098129741.

Japanese Office Action mailed Nov. 8, 2012 in corresponding Japanese Patent Application No. 2009-215328.

* cited by examiner

LITHOGRAPHIC APPARATUS AND METHOD

This application claims priority and benefit under 35 U.S.C. §119(e) to U.S. Provisional Patent Application No. 61/136,703, entitled "Lithographic Apparatus and Method", filed on Sep. 26, 2008. The content of that application is incorporated herein in its entirety by reference.

FIELD

The present invention relates to a lithographic apparatus and method.

BACKGROUND

A lithographic apparatus is a machine that applies a desired pattern onto a substrate or part of a substrate. A lithographic apparatus may be used, for example, in the manufacture of flat panel displays, integrated circuits (ICs) and other structures involving fine features. In a conventional apparatus, a patterning device, which may be referred to as a mask or a reticle, may be used to generate, for example, a circuit pattern corresponding to an individual layer of a flat panel display (or other structure). This pattern may be transferred on (part of) the substrate (e.g. a glass plate), e.g. via imaging onto a layer of radiation-sensitive material (resist) provided on the substrate.

Instead of a circuit pattern, the patterning device may be used to generate other patterns, for example a color filter pattern, or a matrix of dots. Instead of a mask, the patterning device may comprise a plurality of individually controllable elements (e.g. in the form of an array). An advantage of such a system compared to a mask-based system is that the pattern can be changed more quickly and for less cost.

Existing processes for fabricating semiconductor or other devices are usually based on a sequence of steps which involve the creation of layers and/or areas with different electrical properties on or within a substrate. As is known in the art, one of the most frequently used processes for fabricating such devices is the photolithography process. In a commercial environment, photolithographic processes often involve the exposure of substrates with a patterned beam of radiation in order to create patterns on those substrates. In order to create a patterned radiation beam, a radiation beam is transmitted through or reflected off a mask or reticle provided with a fixed pattern.

A problem associated with existing photolithography processes is the fixed nature of the pattern provided by the mask or reticle. A fixed pattern provided by the mask or reticle is not changeable without changing the mask or reticle to one provided with another fixed pattern.

SUMMARY

Because the patterns are fixed, there is little or no opportunity for correcting, for example, unacceptable deviations of device properties caused by processing steps used in the fabrication of that device. For instance, the uniformity of pixel performance in OLED (organic light-emitting diode) TFT (thin-film transistor) displays is important. Even a small variation in the electrical properties of the TFTs over an area of the display may cause non-uniform emission of light from the display in that area, sometimes referred to as a mura effect. As a result of the mura effect, image quality of the display is severely degraded.

The OLED TFT display example given above is one example of a number of composite electronic devices that comprise a large number of supposedly identical devices. For these composite devices to work satisfactorily, or at all, it is often the case that a difference between the performance (e.g. electrical, optical, etc) of each supposedly identical device that forms the composite device should be as small as possible.

In one example, one or more diodes used in a rectifying bridge may fail if the diodes of the bridge have only slightly different electrical properties with respect to one another. In another example, a balanced mixer constructed using supposedly identical diodes will have poor performance if the diodes have, in reality, even slightly different electrical properties. The poor performance may be, for example, the generation of non-linear harmonics, a degraded bandwidth, a low conversion coefficient, etc. In yet another example, an antenna built using an array of supposedly identical diodes will generate a poor emission beam pattern (or not receive/detect a beam in an acceptable manner) if the diodes, in reality, have different electrical properties.

Accordingly, it is desirable, for example, to provide a lithographic apparatus and method for solving at least one of the problems referred to above and/or a problem not mentioned herein. For example, it is desirable to provide a lithographic apparatus and method which may be used to improve the performance, efficiency and/or functionality of devices fabricated using lithography.

According to an embodiment, there is provided a lithographic method, the method comprising: using information at least indicative of a desired shape or size of a constituent part of a device to implement the desired shape or size of the constituent part of the device, the desired shape or size being related to a measured property of a layer of material in which the constituent part of the device is to be created, at least a part of the implementation comprising determining a configuration of a plurality of individually controllable elements that would be necessary to create in a radiation beam a pattern which is sufficient to implement the desired shape or size of the constituent part of the device when creating the constituent part of the device.

Before determining a configuration of a plurality of individually controllable elements that would be necessary to create in a radiation beam a pattern which is sufficient to implement the desired shape or size of the constituent part of the device when creating the constituent part of the device, the method may further comprise using information at least indicative of a measured property of the layer of material to determine a desired shape or size of the constituent part of the device that is to be created using the layer of material.

Before determining a configuration of a plurality of individually controllable elements that would be necessary to create in a radiation beam a pattern which is sufficient to implement the desired shape or size of the constituent part of the device when creating the constituent part of the device, and/or before using information at least indicative of a measured property of the layer of material to determine a desired shape or size of the constituent part of the device that is to be created using the layer of material, the method may further comprise measuring the property of the layer of material.

After determining a configuration of a plurality of individually controllable elements that would be necessary to create in a radiation beam a pattern which is sufficient to implement the desired shape or size of the constituent part of the device when creating the constituent part of the device, the method may further comprise controlling the configuration of the plurality of individually controllable elements to implement the determined configuration.

The method may further comprise using the plurality of individually controllable elements in the determined configuration to create in the radiation beam the pattern which is sufficient to implement the desired shape or size of the constituent part of the device.

The method may further comprise projecting the patterned radiation beam onto the layer of material, or onto a layer of radiation sensitive material provided on that layer of material, in order to, at least in part, create the constituent part of the device with the desired shape or size.

Controlling the configuration of the plurality of individually controllable elements may comprise: controlling a position of one or more elements of the plurality of individually controllable elements, and/or controlling an orientation of one or more elements of the plurality of individually controllable elements, and/or controlling a shape of one or more elements of the plurality of individually controllable elements, and/or controlling which of one or more elements of the plurality of individually controllable elements emit radiation.

The desired shape or size of the constituent part of the device may be 'desired' in that the desired shape or size results in an effect in a property or operation of the constituent part of the device, and/or of the device as a whole. The effect may be: an improved performance of the constituent part of the device, and/or of the device as a whole, and/or an increased efficiency of the constituent part of the device, and/or of the device as a whole, and/or an improved or increased functionality of the constituent part of the device, and/or of the device as a whole.

According to an embodiment, there is provided a lithographic apparatus, comprising: a plurality of individually controllable elements, configured to create a pattern in a radiation beam; a projection system, configured to project the patterned radiation beam onto a substrate; and a control arrangement, the control arrangement configured to use information at least indicative of a desired shape or size of a constituent part of a device to implement the desired shape or size of the constituent part of the device, the desired shape or size being related to a measured property of a layer of material in which the constituent part of the device is to be created, at least a part of the implementation comprising determining a configuration of a plurality of individually controllable elements that would be necessary to create in a radiation beam a pattern which is sufficient to implement the desired shape or size of the constituent part of the device when creating the constituent part of the device.

According to an embodiment, there is provided a lithographic method, the method comprising: using information at least indicative of a desired change in the shape or size of a constituent part of a first device to implement the change in the shape or size of a constituent part of a subsequently created second device, at least a part of the implementation comprising determining a configuration of a plurality of individually controllable elements of a lithographic apparatus that would be necessary to create in a radiation beam a pattern which is sufficient to implement the desired change in the shape or size of the constituent part of the subsequently created second device.

Before determining a configuration of the plurality of individually controllable elements of the lithographic apparatus that would be necessary to create in the radiation beam a pattern which is sufficient to implement the desired change in the shape or size of the constituent part of the subsequently created second device, the method may further comprise using information at least indicative of a property of the first device to determine the desired change in the shape or size of the constituent part of the first device that is to be implemented in the subsequently created second device.

Before determining a configuration of the plurality of individually controllable elements of the lithographic apparatus that would be necessary to create in the radiation beam a pattern which is sufficient to implement the desired change in the shape or size of the constituent part of the subsequently created second device, and/or before using information at least indicative of the property of the first device to determine the desired change in the shape or size of the constituent part of the first device that is to be implemented in the subsequently created second device, the method may further comprise measuring the property of the first device.

After determining the configuration of the plurality of individually controllable elements of the lithographic apparatus that would be necessary to create in the radiation beam a pattern which is sufficient to implement the desired change in the shape or size of the constituent part of the subsequently created second device, the method may further comprise controlling the configuration of the plurality of individually controllable elements to implement the determined configuration. The method may further comprise using the plurality of individually controllable elements in the determined configuration to create in the radiation beam the pattern which is sufficient to implement the desired change in the shape or size of the constituent part of the subsequently created second device. The method may further comprise projecting the patterned radiation beam onto a substrate, or onto material provided on the substrate, in order to, at least in part, create the constituent part of the second device.

Controlling the configuration of the plurality of individually controllable elements may comprise changing the configuration of the plurality of individually controllable elements from a first configuration, that was used to create a pattern in a radiation beam that was used to create the first device, to a second configuration, the second configuration being the determined configuration.

Controlling the configuration of the plurality of individually controllable elements may comprise: controlling a position of one or more elements of the plurality of individually controllable elements, and/or controlling an orientation of one or more elements of the plurality of individually controllable elements, and/or controlling a shape of one or more elements of the plurality of individually controllable elements, and/or controlling which of one or more elements of the plurality of individually controllable elements emit radiation and/or controlling an optical property of one or more elements of the plurality of individually controllable elements (e.g. if the elements are acousto-optical light modulators, where an optical property of the modulators can be changed by an acoustic wave which induces a change in optical property of the crystal). The elements could be mirrors, lenses, deflectors, modulators, diffracting elements, gratings, radiation emitting or transmitting elements, etc.

The plurality of the individually controllable elements may be a plurality of LEDs or laser diodes. The intensity of each individual LED or laser diode can be switched on or off, or attenuated. Another radiation source (such as an arc lamp or laser) may not be necessary if the plurality of the individually controllable elements comprises LEDs, laser diodes or other radiation emitting elements.

The desired change in shape or size of the constituent part of the subsequently created second device may be desired in that the desired change results in an effect (e.g. a desired effect) in a property or operation of the constituent part of the subsequently created second device, and/or of the second device as a whole. In an embodiment, the effect is: an improved performance of the constituent part of the subsequently created second device, and/or of the second device as a whole, and/or an increased efficiency of the constituent part of the subsequently created second device, and/or of the second device as a whole, and/or an improved or increased functionality of the constituent part of the subsequently created second device, and/or of the second device as a whole.

The first and subsequently created second devices may be different versions of the same general device (e.g. an iteration in the design or development of a device).

According to an embodiment, there is provided a lithographic apparatus, comprising: a plurality of individually controllable elements, configured to create a pattern in a radiation beam; a projection system, configured to project the patterned radiation beam onto a substrate; and a control arrangement, the control arrangement configured to use information at least indicative of a desired change in the shape or size of a constituent part of a first device to implement the change in the shape or size of a constituent part of a subsequently created second device, at least a part of the implementation comprising determining a configuration of the plurality of individually controllable elements that would be necessary to create in the radiation beam a pattern which is sufficient to implement the desired change in the shape or size of the constituent part of the subsequently created second device.

According to an embodiment, there is provided least a part of a device made using any of the methods described above, or using any of the apparatuses described above.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
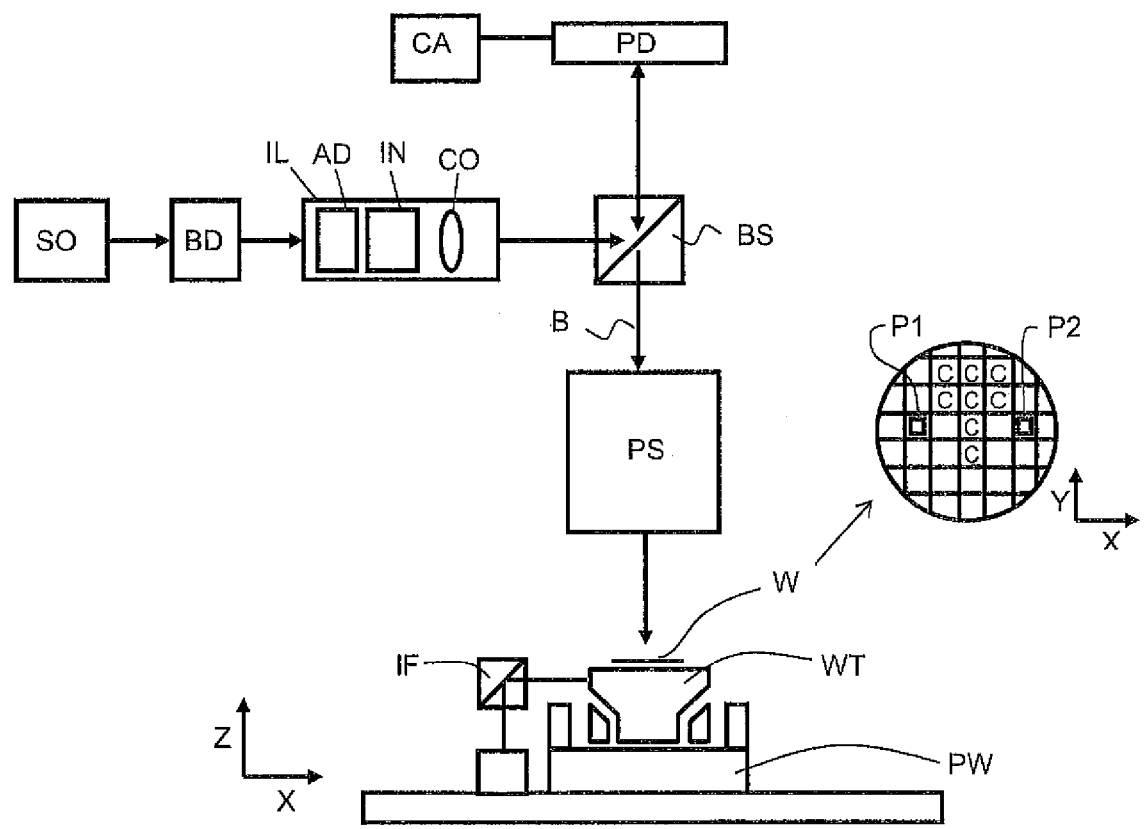
FIG. 1 schematically depicts a lithographic apparatus that may be used to implement an embodiment of the invention.

FIG. 1 schematically depicts a lithographic apparatus that may be used to implement an embodiment of the invention. The apparatus comprises:

an illumination system (illuminator) IL configured to condition a radiation beam B (e.g. UV radiation);

a patterning device PD (e.g. a plurality of individually controllable elements) configured to modulate the radiation beam B; in general the position of the plurality of individually controllable elements will be fixed relative to item PS; however it may instead be connected to a positioner configured to accurately position the plurality of individually controllable elements in accordance with certain parameters;

a control arrangement CA configured to, for example, determine a configuration of the patterning device PD, and/or control the patterning device PD to implement that configuration;

a substrate table WT constructed to support a substrate (e.g. a resist-coated substrate) W and connected to a positioner PW configured to accurately position the substrate in accordance with certain parameters; and a projection system (e.g. a refractive projection lens system) PS configured to project the beam of radiation modulated by the plurality of individually controllable elements onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The term "patterning device", used herein should be broadly interpreted as referring to any device that can be used to modulate the cross-section of a radiation beam such as to create a pattern in a target portion of the substrate. It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the plurality of individually controllable elements. This may be the case in an arrangement in which the eventual pattern formed on each part of the substrate is built up over a given period of time or a given number of exposures during which the pattern in the plurality of individually controllable elements and/or the relative position of the substrate changes. Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices that are or comprise a plurality of individually controllable elements include, e.g., programmable mirror arrays, laser diode arrays, light emitting diode arrays, grating light valves, and liquid crystal display (LCD) arrays. Patterning devices whose pattern is programmable with the aid of electronic means (e.g., a computer), such as patterning devices comprising a plurality of programmable elements, that can each modulate the intensity of a portion of the radiation beam (e.g., all the devices mentioned in the previous sentence except for the reticle), are collectively referred to herein as "contrast devices". It should be appreciated that an electronically programmable patterning device having a plurality of programmable elements that impart a pattern to the radiation beam by modulating the phase of a portion of the radiation beam relative to adjacent portions of the radiation beam may also be used. In an embodiment, the patterning device comprises at least 10 programmable elements, e.g. at least 100, at least 1,000, at least 10,000, at least 100,000, at least 1,000,000, or at least 10,000,000 programmable elements. Embodiments of several of these devices are discussed in some more detail below:

A programmable mirror array. This may comprise, for example, a matrix-addressable surface having a viscoelastic control layer and a reflective surface. The basic principle behind such an apparatus is that (for example)

addressed areas of the reflective surface reflect incident radiation as diffracted radiation, whereas unaddressed areas reflect incident radiation as undiffracted radiation. Using an appropriate spatial filter, the undiffracted radiation can be filtered out of the reflected beam, leaving only the diffracted radiation to reach the substrate; in this manner, the beam becomes patterned according to the addressing pattern of the matrix-addressable surface. It will be appreciated that, as an alternative, the filter may filter out the diffracted radiation, leaving the undiffracted radiation to reach the substrate. A plurality of diffractive optical microelectromechanical systems (MEMS) devices may also be used in a corresponding manner. A diffractive optical MEMS device is comprised of a plurality of reflective ribbons that may be deformed relative to one another to form a grating that reflects incident radiation as diffracted radiation. A further alternative embodiment of a programmable mirror array employs a matrix arrangement of tiny mirrors, each of which may be individually tilted about an axis by applying a suitable localized electric field, or by employing a piezoelectric actuator. Once again, the mirrors are matrix-addressable, such that addressed mirrors reflect an incoming radiation beam in a different direction to unaddressed mirrors; in this manner, the reflected beam may be patterned according to the addressing pattern of the matrix-addressable mirrors. The required matrix addressing may be performed using suitable electronic means. More information on mirror arrays as here referred to can be gleaned, for example, from U.S. Pat. Nos. 5,296,891 and 5,523,193, and PCT Patent Application Publication Nos. WO 98/38597 and WO 98/33096.

A programmable LCD array. An example of such a construction is given in U.S. Pat. No. 5,229,872.

The lithographic apparatus may comprise one or more patterning devices. For example, it may have one or more pluralities of individually controllable elements, for example a plurality of arrays of individually controllable elements, each controlled independently of each other. In such an arrangement, some or all of the pluralities of individually controllable elements may have at least one of a common illumination system (or part of an illumination system), a common support structure for the pluralities of individually controllable elements and/or a common projection system (or part of the projection system).

In an embodiment, such as the embodiment depicted in FIG. 1, the substrate W has a substantially circular shape, optionally with a notch and/or a flattened edge along part of its perimeter. In an embodiment, the substrate has a polygonal shape, e.g. a rectangular shape. Embodiments where the substrate has a substantially circular shape include embodiments where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In an embodiment, the substrate has a diameter of at most 500 mm, at most 400 mm, at most 350 mm, at most 300 mm, at most 250 mm, at most 200 mm, at most 150 mm, at most 100 mm, or at most 75 mm. Embodiments where the substrate is polygonal, e.g. rectangular, include embodiments where at least one side, e.g. at least 2 sides or at least 3 sides, of the substrate has a length of at least 5 cm, e.g. at least 25 cm, at least 50 cm, at least 100 cm, at least 150 cm, at least 200 cm, or at least 250 cm. In an embodiment, at least one side of the substrate has a length of at most 1000 cm, e.g. at most 750 cm, at most 500 cm, at most 350 cm, at most 250 cm, at most 150 cm, or at most 75 cm. In an embodiment, the substrate is a rectangular substrate having a length of about 250-350 cm and a width of about 250-300 cm. The thickness of the substrate may vary and, to an extent, may depend, e.g., on the substrate material and/or the substrate dimensions. In an embodiment, the thickness is at least 50 μm, for instance at least 100 μm, at least 200 μm, at least 300 μm, at least 400 μm, at least 500 μm, or at least 600 μm. In one embodiment, the thickness of the substrate is at most 5000 μm, for instance at most 3500 μm, at most 2500 μm, at most 1750 μm, at most 1250 μm, at most 1000 μm, at most 800 μm, at most 600 μm, at most 500 μm, at most 400 μm, or at most 300 μm. The substrate referred to herein may be processed, before or after exposure, in for example a track (a tool that typically applies a layer of resist to a substrate and develops the exposed resist), a metrology tool and/or an inspection tool.

In an embodiment, a resist layer is provided on the substrate. In an embodiment, the substrate W is a wafer, for instance a semiconductor wafer. In an embodiment, the wafer material is selected from the group consisting of Si, SiGe, SiGeC, SiC, Ge, GaAs, InP, and InAs. In one embodiment, the wafer is a III/V compound semiconductor wafer. In an embodiment, the wafer is a silicon wafer. In an embodiment, the substrate is a ceramic substrate. In an embodiment, the substrate is a glass substrate. Glass substrates may be useful, e.g., in the manufacture of flat panel displays and liquid crystal display panels. In an embodiment, the substrate is a plastic substrate. In an embodiment, the substrate is transparent (for the naked human eye). In an embodiment, the substrate is colored. In an embodiment, the substrate is absent a color.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The projection system may image the pattern on the plurality of individually controllable elements such that the pattern is coherently formed on the substrate.

As here depicted, the apparatus is of a reflective type (e.g. employing a reflective plurality of individually controllable elements). Alternatively, the apparatus may be of a transmissive type (e.g. employing a transmissive plurality of individually controllable elements).

The lithographic apparatus may be of a type having two (dual stage) or more substrate tables. In such "multiple stage" machines the additional table(s) may be used in parallel, or preparatory steps may be carried out on one or more tables while one or more other tables are being used for exposure.

The lithographic apparatus may also be of a type wherein at least a portion of the substrate may be covered by an "immersion liquid" having a relatively high refractive index, e.g. water, so as to fill a space between the projection system and the substrate. An immersion liquid may also be applied to other spaces in the lithographic apparatus, for example, between the patterning device and the projection system. Immersion techniques are known for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. In an embodiment, the radiation source provides radiation having a wavelength of at least 5 nm, e.g. at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In an embodiment, the radiation provided by radiation source SO has a wavelength of at most 450 nm, e.g. at most 425 nm, at most 375 ran, at most 360 nm, at most 325 nm, at most 275 nm, at most 250 nm, at most 225 nm, at most 200 nm, or at most 175 nm. In an embodiment, the radiation has a wavelength including 436 nm, 405 nm, 365 nm, 355 nm, 248 nm, 193 nm, 157 nm, and/or 126 nm. In an embodiment, the radiation includes a wavelength of around 365 nm or around 355 nm. In an embodiment, the radiation includes a broad band of wavelengths, for example encompassing 365, 405 and 436 nm. A 355 nm laser source could be used. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system. If the patterning device is a radiation source itself, e.g. a plurality of laser diodes (e.g. an array) or a plurality of light emitting diodes (e.g. an array), the apparatus may be designed without an illumination system or at least a simplified illumination system (e.g., the need for radiation source SO may be obviated).

The illuminator IL, may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam to have a desired uniformity and intensity distribution in its cross-section. The illuminator IL, or an additional component associated with it, may also be arranged to divide the radiation beam into a plurality of sub-beams that may, for example, each be associated with one or a plurality of the individually controllable elements of the plurality of individually controllable elements. A two-dimensional diffraction grating may, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., a plurality of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF (e.g. an interferometric device, linear encoder or capacitive sensor), the substrate table WT can be moved accurately, e.g. so as to position different target portions C in the path of the radiation beam B. Where used, the positioning means for the plurality of individually controllable elements can be used to correct accurately the position of the patterning device PD with respect to the path of the beam B, e.g. during a scan. In an embodiment, movement of the substrate table WT is realized with the aid of a long-stroke module (coarse positioning) and a short-stroke module (fine positioning), which are not explicitly depicted in FIG. 1. In an embodiment, the apparatus is absent at least a short stroke module for moving substrate table WT. A similar system may also be used to position the plurality of individually controllable elements. It will be appreciated that the beam B may alternatively/additionally be moveable while the object table and/or the plurality of individually controllable elements may have a fixed position to provide the relative movement. Such an arrangement may assist in limiting the size of the apparatus. As a further alternative, which may e.g. be applicable in the manufacture of flat panel displays, the position of the substrate table WT and the projection system PS may be fixed and the substrate W may be arranged to be moved relative to the substrate table WT. For example, the substrate table WT may be provided with a system for scanning the substrate W across it at a substantially constant velocity.

As shown in FIG. 1, the beam of radiation B may be directed to the patterning device PD by means of a beam splitter BS configured such that the radiation is initially reflected by the beam splitter and directed to the patterning device PD. It should be realized that the beam of radiation B may also be directed at the patterning device without the use of a beam splitter. In an embodiment, the beam of radiation is directed at the patterning device at an angle between 0 and 90°, e.g. between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements may be used to direct the beam of radiation B to the patterning device PD and subsequently to the projection system PS. In particular, an arrangement such as is shown in FIG. 1 may not be required if a transmissive patterning device is used.

The depicted apparatus can be used, for example, in one or more of four modes:

1. In step mode, the plurality of individually controllable elements and the substrate are kept essentially stationary, while an entire pattern imparted to the radiation beam is projected onto a target portion C at one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the plurality of individually controllable elements and the substrate are scanned synchronously while a pattern imparted to the radiation beam is projected onto a target portion C (i.e. a single dynamic exposure). The velocity and direction of the substrate relative to the plurality of individually controllable elements may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the plurality of individually controllable elements is kept essentially stationary and the entire pattern is projected onto a target portion C of the substrate W using pulsed radiation. The substrate table WT is moved with an essentially constant speed such that the projection beam B is caused to scan a line across the substrate W. The pattern on the plurality of individually controllable elements is updated as required between pulses of the radiation and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. In continuous scan mode, essentially the same as pulse mode except that the substrate W is scanned relative to the modulated beam of radiation B at a substantially constant speed and the pattern on the plurality of individually controllable elements is updated as the beam B scans across the substrate W and exposes it. A substantially constant radiation source or a pulsed radiation source, synchronized to the updating of the pattern on the plurality of individually controllable elements may be used.

Combinations and/or variations on the above described modes of use or entirely different modes of use may also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern may be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary not only to maximum or minimum intensity levels but also to intensity levels between the maximum and minimum intensity levels. This is commonly referred to as "grayscaling".

Grayscaling provides greater control of the position of the pattern feature boundaries than is possible in a lithography system in which the radiation intensity provided to the substrate by a given individually controllable element can only be set to two values (namely just a maximum value and a minimum value). In an embodiment, at least three different radiation intensity values can be projected onto the substrate, e.g. at least 4 radiation intensity values, at least 8 radiation intensity values, at least 16 radiation intensity values, at least 32 radiation intensity values, at least 64 radiation intensity values, at least 128 radiation intensity values or at least 256 radiation intensity values.

It should be appreciated that grayscaling may be used for additional or alternative purposes to that described above. For example, the processing of the substrate after the exposure may be tuned such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manlier. Accordingly, grayscaling may be used to provide a radiation dose profile across the substrate having more than two desired dose levels. In an embodiment, the radiation dose profile has at least 2 desired dose levels, e.g. at least 3 desired radiation dose levels, at least 4 desired radiation dose levels, at least 6 desired radiation dose levels or at least 8 desired radiation dose levels.

It should further be appreciated that the radiation dose profile may be controlled by methods other than by merely controlling the intensity of the radiation received at each point on the substrate, as described above. For example, the radiation dose received by each point on the substrate may alternatively or additionally be controlled by controlling the duration of the exposure of the point. As a further example, each point on the substrate may potentially receive radiation in a plurality of successive exposures. The radiation dose received by each point may, therefore, be alternatively or additionally controlled by exposing the point using a selected subset of the plurality of successive exposures.

In order to form the desired pattern on the substrate, it is necessary to set each of the individually controllable elements in the patterning device to the requisite state at each stage during the exposure process. Therefore control signals, representing the requisite states, must be transmitted to each of the individually controllable elements. In an embodiment, the lithographic apparatus includes a controller that generates the control signals. The pattern to be formed on the substrate may be provided to the lithographic apparatus in a vector-defined format such as GDSII. In order to convert the design information into the control signals for each individually controllable element, the controller includes one or more data manipulation devices, each configured to perform a processing step on a data stream that represents the pattern. The data manipulation devices may collectively be referred to as the "datapath".

The data manipulation devices of the datapath may be configured to perform one or more of the following functions: converting vector-based design information into bitmap pattern data; converting bitmap pattern data into a radiation dose map (namely a radiation dose profile across the substrate); converting a radiation dose map into radiation intensity values for each individually controllable element; and converting the radiation intensity values for each individually controllable element into corresponding control signals.

Figure 2A:
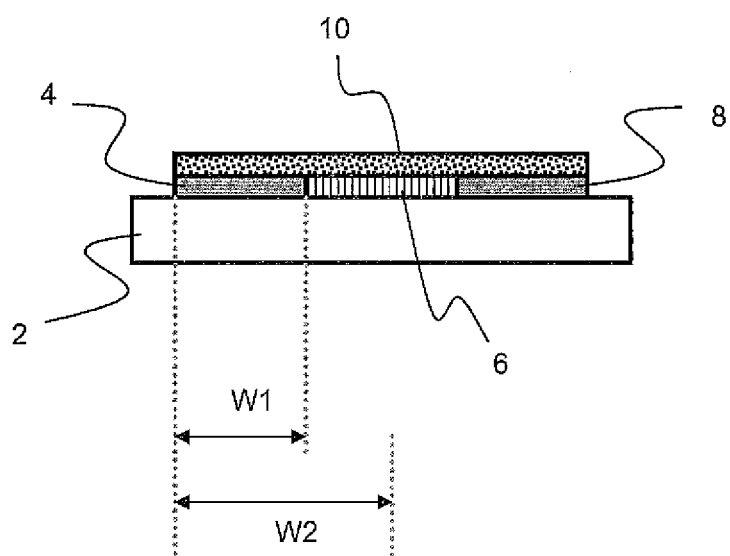
FIG. 2a schematically depicts a device fabricated using a photolithography process.

FIG. 2a schematically depicts a device fabricated using a photolithography process. The device is non-specific, and does not necessarily correspond to an existing or proposed device. The device shown is merely used as aid to explaining the principles associated with an embodiment of the present invention.

Referring to FIG. 2a, the device is shown as comprising a substrate 2 (for example, all, or a part of, the substrate W described above). Provided on a surface of the substrate 2 is a first layer. The first layer comprises a first structure 4, a second structure 6 and a third structure 8. Extending across the first structure 4, second structure 6, and third structure 8 is a fourth structure 10.

Examination of the device may be undertaken to determine information at least indicative of one or more properties of that device (e.g. information at least indicative of one or more properties of a constituent part of that device). In an embodiment, the technique used to perform such examination does not damage the device. If examination is undertaken on a plurality of devices (for example located on a common substrate), desirably such examination does not damage a significant number of devices of that plurality. Suitable examination techniques may include or involve optical imaging, photoluminescence, Raman spectroscopy, x-ray diffraction (XRD) measurements, electron microscope measurements (e.g. scanning electron microscope measurements), capacitance-voltage (C(V)) measurements, measurements by a metal-air-semiconductor (MAIS) technique, etc. The number or in other words density of points of the device or devices where measurements are made will be a balance between the minimization of the time needed for examination of the device or devices, and the non-linearity of the variation of examination results across the device or devices. The number or density of measurement points could therefore vary from several points per device to measuring a single point per device on one or more devices out of a number of devices.

Data obtained using one or more of the aforementioned techniques may be used to determine or measure one or more properties of the device (or a constituent part of the device). Such properties may include, but are not limited to, the shape or size of a structure (for example, a layer thickness or height), a doping profile, carrier mobility, etc. For example, in an array of TFTs carrier mobility or gate dielectric thickness may be measured for TFTs across the array.

Referring to the device shown in FIG. 2a as a generic example, the width W1 of the first structure 4 may be determined using the aforementioned techniques. Variation of the width W1 may, for example, have an affect on the electrical properties and therefore functionality of the device as a whole. Therefore, in order to improve the functionality of the device, a change in the width of the first structure 4 may be required. Of course, it would be difficult or impossible to change the width of the first structure 4. Instead, the width of a first structure in a subsequently created device will be changed in order to improve the functionality of that device.

In standard photolithography where masks or reticles having fixed patterns are used, the implementation of a change in a size or shape (e.g. a width) of a particular constituent part of a device in the subsequent creation of another device would be difficult, if not practically impossible. This is because the desired change in the shape or size of the constituent part would need to be made by changing the pattern of a patterned radiation beam used to provide a pattern, related to that constituent part, on the substrate. Changing the pattern in the radiation beam would require the changing of a fixed pattern of the reticle or mask. Changing a fixed pattern of a reticle or mask would, in general, require the creation of a new mask or reticle and this would usually be prohibitively expensive. The expense would increase even further if further iterations and alterations of the shape or size of one or more constituent parts of the device was desired, since there would be an associated need for repeated changes and iterations in the fixed pattern of the mask or reticle.

A problem associated with the use of a fixed mask or reticle pattern can be overcome by using a plurality of individually controllable elements to create a pattern in a radiation beam, as described above. Rather than having to repeatedly create or re-create a new mask or reticle with a different fixed pattern, according to an embodiment of the present invention the configuration of the plurality of individually controllable elements can be controlled (e.g. changed) to change the pattern created in the radiation beam. Such a change can be used to effect the desired change in the shape or size of a constituent part of a device that is to be created, for example a next version of the device on which examination was undertaken. In an embodiment, the desired change in the shape or size is a required change in the shape or size. For example, the configuration of the plurality of individually controllable elements may be changed by controlling the position and/or orientation and/or shape of one or more elements of the plurality (for example, the degree of tilt of the one or more elements), by changing the elements that contribute to the patterning of the radiation beam (by selectively allowing or preventing one or more elements of the plurality from, for example, transmitting or reflecting radiation), by changing which elements of the plurality are emitting radiation, or by controlling an optical property of one or more elements of the plurality of individually controllable elements.

Figure 2B:
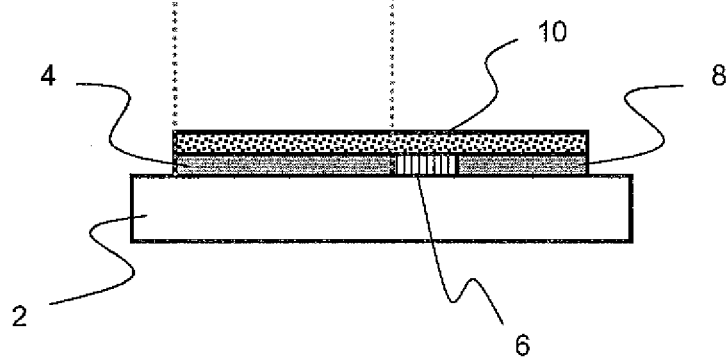
FIG. 2b schematically depicts the same general device as shown in FIG. 2a, with a correction to a constituent part of the device in accordance with an embodiment of the present invention.

Referring back to the general example shown in and described with reference to FIG. 2a it was described that a change in the width W1 was desired in order to improve the functionality of the device. In order to achieve this, an optimum configuration of a pattern in a patterned radiation beam can be determined which will result in the desired change in the size or shape of the first structure 4. A control arrangement of the lithographic apparatus may undertake such determination. The control arrangement may, alternatively or additionally, control the plurality of individually controllable elements to implement the determined configuration when creating the first structure 4 in the creation of a subsequent device. In the creation of such a subsequent device, resist provided on a substrate will be exposed according to the determined pattern to effect the desired change in the shape or size of the first structure. FIG. 2b shows a subsequently created device, in which the first structure 4 has an increased width W2. The increased width W2 leads to, for example, an improved performance of the device.

When the further device (or, for example, a further batch of such devices) has been fabricated, the examination process referred to above may be undertaken again in order to determine whether the desired change in the shape or size of the first structure 4 has brought about satisfactory improvement (or, indeed, any improvement) in the functionality, performance, efficiency, etc. of the device. If the determination of the property of the device indicates that the functionality, performance, efficiency, etc. has not improved, the process of determining a more improved shape or size for the first structure (or other constituent part or parts of the device) may be undertaken again, and a configuration of the plurality of individually controllable elements determined to implement the change in the size or shape of the first structure (or other constituent part or parts of the device).

Figure 3:
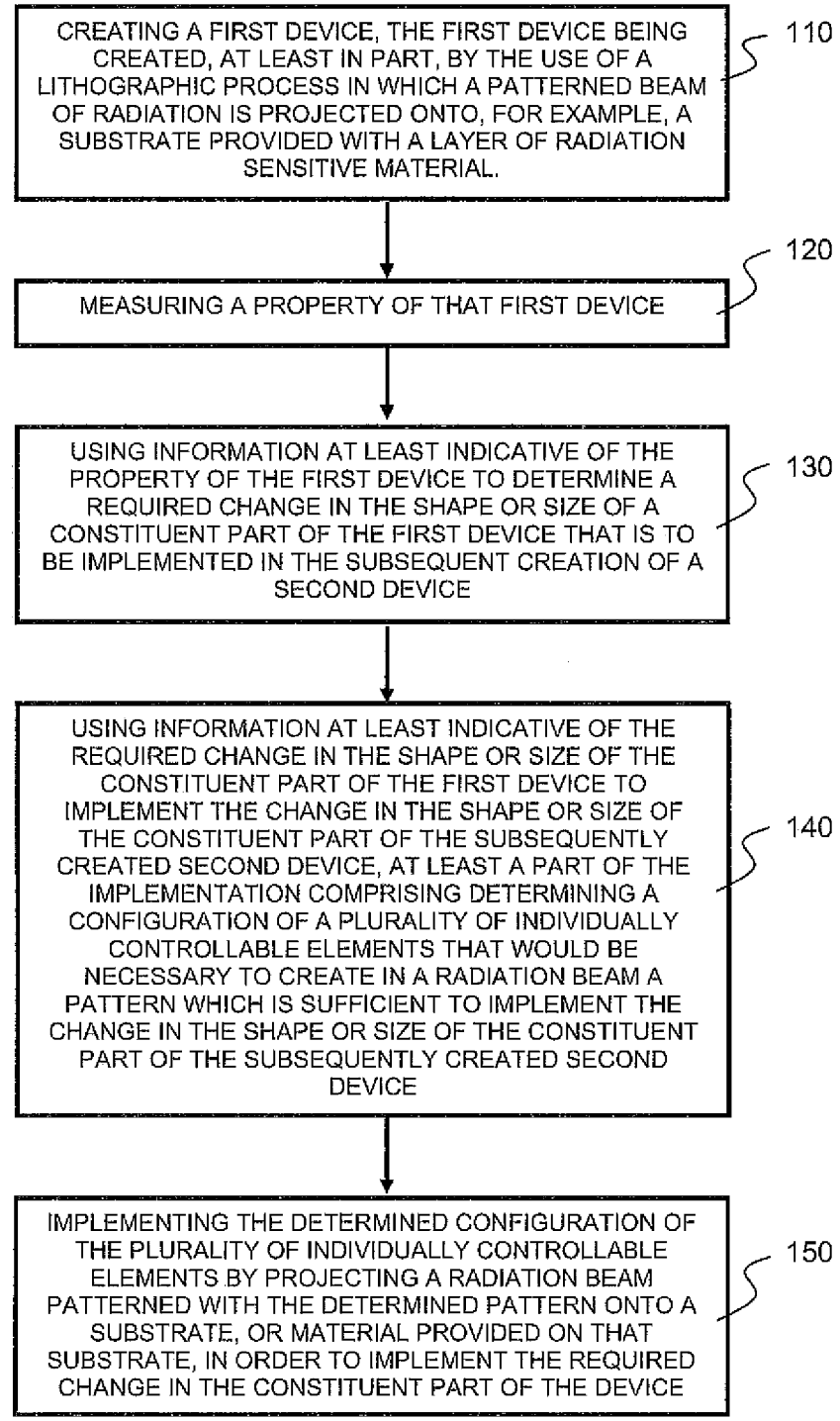
FIG. 3 is a flow chart schematically depicting, in general, an embodiment of the present invention.

FIG. 3 is a flow chart schematically depicting, in general terms, a method according to an embodiment of the present invention.

A first stage 110 of the method comprises creating a first device. The first device may, for example, be one of a batch of devices or an array of devices. The first device is created, at least in part, by the use of a lithographic process in which a patterned beam of radiation is projected onto a substrate provided with a layer of radiation sensitive material (e.g. resist). The pattern in the beam of radiation may be created using, for example, a plurality of individually controllable elements as described above. In other embodiments, the first stage 110 in the described method may not be required, as a first device may already have been created.

In a second stage 120 of the method, a property of the first device is measured. The property, and the way it is measured, may be undertaken as described above in relation to FIGS. 2a and 2b. Again, in other embodiments the second stage 120 of the method may not need to be undertaken, for instance if a property of the first device has already been measured.

In a third stage 130 of the method, information at least indicative of the measured property of the first device is used to determine a change that is desired in the shape or size of (at least) a constituent part of the first device that is to be implemented in the subsequent creation of a second device (e.g. an improved version of the first device). The change in the shape or size of the constituent part of the device has been described as 'desired'. It is desired in that the property of the device that has been measured has at least indicated (or it can be inferred or determined therefrom) that such a change in the shape or size of the constituent part of the device would result in an effect (e.g. a desired effect) in the operation of the device, for example an improvement in its performance, efficiency or functionality. In other words, the change in the shape or size of the constituent part is desired in order to improve the performance, efficiency, functionality, etc of the device. Again, this third stage 130 of the method may not be required if the desired change in the shape or size of the constituent part of the first device that is to be implemented in the subsequent creation of a second device is already known.

In a fourth stage 140 of the method, information at least indicative of the desired change in the size or shape of the constituent part of the first device is used to implement the change in the shape or size of the constituent part of the subsequently created second device. At least a part of the implementation comprises determining a configuration of a plurality of individually controllable elements that would be necessary to create in a radiation beam a pattern which is sufficient to implement the desired change in the shape or size of the constituent part of the subsequently created second device. In other words, this part of the implementation involves determining the configuration, or change in the configuration, of the plurality of individually controllable elements that is necessary to put into effect the desired change in size or shape of the constituent part of the device that is to be created in a subsequent exposure. For instance, the determination may involve the determination of which element or elements of the plurality of individually controllable elements need to be moved, reoriented, turned on or off in order to effect the desired change in the shape or size of the constituent part of the second device. This fourth stage 140 of the method could be undertaken by a control arrangement of the lithographic apparatus, for example a computer or the like.

The fourth stage 140 of the method is advantageous in that it allows the use of information derived from a property of a device to be fed back into the creation, or in other words fabrication, of a second (for example, version) device of the same general device. This part of the method is advantageous because the information is fed back into the control of a plurality of individually controllable elements. The configuration of the plurality of individually controllable elements can be easily and rapidly changed from one configuration to another with little or no associated costs. This is in stark contrast to the situation whereby a patterning device with a fixed pattern might be used to implement the desired change in size or shape of a constituent part of a device to be subsequently created. This is because it is difficult or impossible to quickly and cheaply create, for example, slightly different versions of a mask or reticle having a fixed pattern that would be necessary to implement the desired change.

A fifth stage 150 of the method comprises, in general, implementing the determined configuration of the plurality of individually controllable elements by projecting a radiation beam patterned with the determined pattern onto a substrate, or material provided on that substrate, in order to implement the desired change in the constituent part of the second (i.e. subsequently created) device.

A sixth stage of the method, not shown in FIG. 3, may comprise repeating one or all stages of the method shown in the FIG. 3. For instance, once the second device (or in other words, the second version of the first device) has been created, the entire method may be undertaken in respect of that second device. The method may be undertaken in order to, for example, optimize the change in size or shape of the constituent part, change the size or shape of another constituent part, or to verify that the change in the constituent part has had the desired effect of, for example, improving the functionality, performance, etc of the second device.

A change in the shape or size of constituent parts of one or more devices to be created on a substrate may be undertaken "on-the-fly". For example, the measurement of and/or change in shape or size of one or more constituent parts of one or more devices may be undertaken as a substrate on which the devices are being created is being exposed to radiation (e.g. in a step-wise or scanned manner).

Embodiments of the present invention have been described above in generic form. Specific examples of implementations will now be described with reference to FIG. 4a, FIG. 4b and FIG. 5.

Figure 4A:
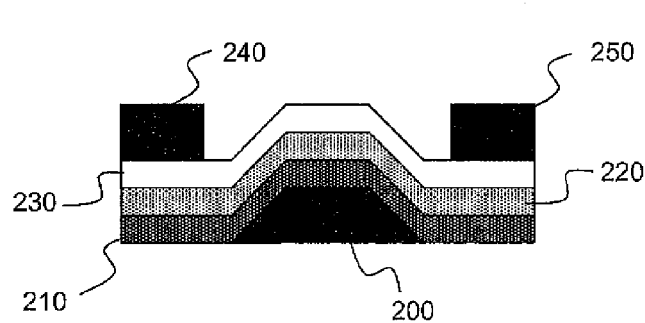
FIGS. 4a and 4b schematically depict cross-section and plan views, respectively, of a TFT.
Figure 4B:
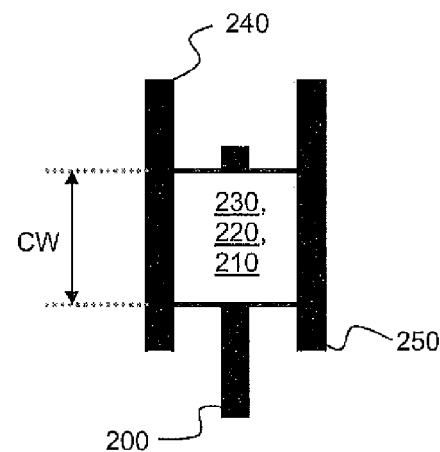

FIG. 4a and FIG. 4b schematically depict a TFT in section view and plan view respectively. The TFT comprises a gate 200. Provided on top of that gate 200 is an SiN layer 210. Provided on top of that SiN layer 210 is an Si layer 220. Provided on top of that Si layer 220 is an Si n+ layer 230 (i.e. a layer of n-type Si). Located on one side of the Si n+ layer 230 is a source 240. Located on an opposite side of the Si n+ layer layer 230 is a drain 250.

Current flowing through the TFT is proportional to what is known in the art as the channel width CW as well as the mobility of carriers in the TFT. It is known in the art that the mobility in micro crystalline silicon layers produced by, for example, a PECVD (plasma-enhanced chemical vapor deposition) process is difficult to control. In accordance with an embodiment of the present invention, one or more properties of the TFT can be measured, and the shape or size of one or more constituent parts of a subsequently created TFT changed to compensate for the difference in carrier mobilities between TFTs (e.g. across an active display matrix formed from an array of TFTs).

The current flowing through the TFT can be described by the following equations:

$$I_D = \mu \frac{\varepsilon}{t} \frac{W}{L} \left[ (V_{GS} - V_T) V_{DS} - \frac{V_{DS}^2}{2} \right] \text{ for } V_{DS} < V_{GS} - V_T$$

-continued $$I_D = \mu \frac{\varepsilon}{t} \frac{W}{L} \frac{(V_{GS} - V_T)^2}{2} \text{ for } V_{DS} > V_{GS} - V_T$$

where $I_D$ is the drain current, $\mu$ is the carrier mobility, W is the channel width, L is the channel length, $V_{GS}$ is the gate source voltage, $V_T$ is the threshold voltage, $V_{DS}$ is the drain source voltage, t is the gate insulator thickness and $\in$ is the dielectric constant of gate insulator material.

As can be seen from the above equations, being able to vary the channel width (W) allows for compensation of deviations in the mobility (μ) and gate insulator thickness (t). Typical thickness variation expected when using PECVD processing is 10% across a substrate on which multiple TFTs are created. The variation in the carrier mobilities of the TFTs can be up to 50%. In a worst case scenario, where the thickness variation is greatest and also the mobility variation is greatest, there may exist a variation of the current flowing through each TFT of −55% to +66%. Such variation in the current may be unacceptable. For example, in a display formed from an array of such TFTs, in order to prevent mum effects the variation in the current flowing through each TFT across the display area should, ideally, not differ by more than 3%. As described above, the shape or size of a constituent part of a subsequently created TFT (for example, the channel width (W) or channel length (L)) can be changed by changing the configuration of one or more elements of a plurality of individually controllable elements used to pattern a radiation beam which is, in turn, used to create the constituent part of the subsequently created TFT. Such a change in size or shape of one or more constituent parts of the TFT can be used to correct for the deviation in properties of the constituent parts of the TFT, such as for example the mobility variation and the thickness non-uniformity referred to above.

The typical channel width of a TFT used in an OLED display is 10 μm. As and when required, a lithographic apparatus provided with a patterning device having a plurality of individually controllable elements can be used to vary the channel length (L) by −55% to +66% (or, in absolute terms, in the range from 4.5 μm to 16.6 μm) with an associated critical dimension (CD) accuracy of 1% (or in absolute terms, 100 nm). Thus, the variation in carrier mobility or layer thickness can be compensated for in the creation of subsequent devices by changing the size or shape of a constituent part of the TFT.

An embodiment of the invention is not only applicable to the change in shape or size of a constituent part of a TFT, but is applicable to any device, or part thereof, formed using a photolithographic process.

In one example, the production of a semi-conductor device may require specifications on doping concentrations which are difficult or impossible to meet without having the ability to vary the shape or size of one or more constituent parts of the device. Thus, the ability to vary the size or shape of one or more constituent parts of the device can resolve this problem. Such principles are now discussed in relation to a Schottky diode.

Figure 5:
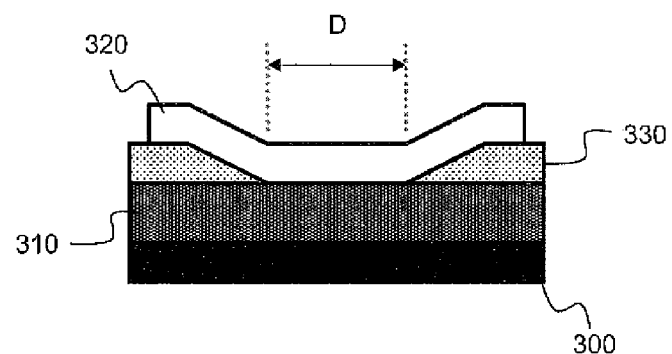
FIG. 5 schematically depicts a cross-section view of a Schottky diode.

FIG. 5 shows a cross-section view of a Schottky diode. The Schottky diode is provided with a back-side metallization layer 300. Provided on top of that back-side metallization layer 300 is a Si layer 310, for example in the form of part of a Si wafer. Provided on top of that Si layer 310 is a metal contact 320 of the Schottky diode. Opposite sides of the metal contact 320 are spaced apart from the Si layer 310 by an $SiO_2$ spacer 330.

The capacitance of the Schottky diode is described by the following equation:

$$C = \pi \frac{D^2}{4} \sqrt{\frac{q\varepsilon N}{2(\phi - V)}}$$

where C is the Schottky diode capacitance, D is the Schottky diode diameter (see FIG. 5), q is the electron charge, $\phi$ is the built-in potential, $\in$ is the dielectric constant, V is the applied voltage and N is the doping concentration.

It can be seen that the capacitance (C) is proportional to the square root of the doping concentration (N) and the square of the Schottky diode diameter (D). It will therefore be appreciated that any variation of the doping concentration (N) can be compensated for by varying the diode area (for example by varying the Schottky diode diameter (D)). For instance, in order to compensate a +/−50% variation of the doping concentration (N) it will be necessary to vary the diameter (D) by only 2.7%.

In a generic application, for example, it could be that Schottky diodes on a substrate should not have a variation of capacitance (C) of more than 1%. A typical diameter (D) of a discrete Schottky diode is 100 μm. A typical doping concentration (N) variation across the substrate on which the diodes are created may be up to 10%. Thus, if the area of the diode (e.g. its size or diameter (D)) is fixed, an unacceptable spread of capacitance values (C) over the substrate of 3.2% will exist. The method described above can be used to compensate for this variation in capacitance values (C) between different Schottky diodes. This compensation may be achieved by controlling the configuration of the plurality of individually controllable elements of the patterning device of the lithographic apparatus to vary the diode diameter (D) appropriately in the range of 1.8% (1.8 μm in absolute values), with an accuracy of 0.1% (100 nm in absolute values). Such diameter variation and accuracy is readily achievable with existing and proposed lithographic apparatuses.

So far, embodiments of the invention have been described in the context of using information at least indicative of a desired change in the shape or size of a constituent part of a first device to implement the change in the shape or size of a constituent part of a subsequently created second device. A different, although closely related, aspect relates to the implementing (e.g. changing) of a desired shape or size of a constituent part of a device as that device is being created (i.e. not in the creation of a constituent part of a subsequently created device). This aspect will now be described in more detail.

Figure 6A:
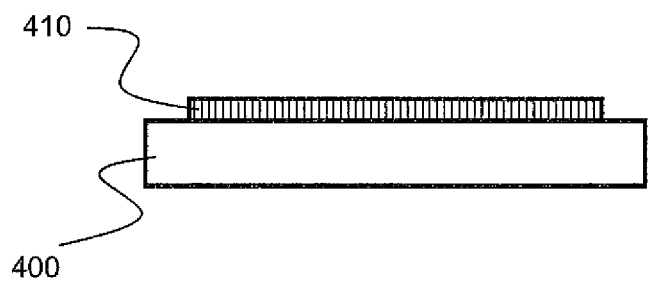
FIGS. 6a to 6d schematically depict the creation of constituent parts of devices in accordance with an embodiment of the present invention.

FIG. 6a schematically depicts a substrate 400 (for example, all, or a part of, the substrate W described above). Provided on a surface of that substrate 400 is a first layer of material 410. The first layer of material 410 will be used to create a constituent part of a device. The constituent part of the device may be formed using the first layer of material 410 by using a photolithographic process to provide a pattern in the first layer of material 410, as is known in the art.

Before a photo lithographic process is undertaken to create a pattern in the first layer of material 410, examination of the first layer of material 410 may be undertaken to determine information at least indicative of one or more properties of that first layer of material 410. In an embodiment, the technique used to perform such examination does not damage the first layer of material. If examination is undertaken on a plurality of points of reference on or in the first layer of material, desirably such examination does not introduce damage at a significant number of reference points of that plurality. Suitable examination techniques may include or involve optical imaging, photoluminescence, Raman spectroscopy, x-ray diffraction (XRD) measurements, electron microscope measurements (e.g. scanning electron microscope measurements), capacitance-voltage (C(V)) measurements, measurements by a metal-air-semi-conductor (MAIS) technique etc. The number, or in other words density of points of the first layer of material 410 where examination is undertaken (i.e. where measurements are made) may be a balance between the minimization of the time needed for examination of the first layer of material 410, and a non-linearity on the variation of examination results across the first layer of material 410. The number of measurement points (or in other words reference points at which measurements are made) could therefore vary from, for example, several points per die on the substrate 400, to a single measurement per die on the substrate.

Data obtained using one or more of the aforementioned techniques may be used to determine or measure one or more properties of the first layer of material. Such properties may include, but are not limited to, doping concentrations or profiles, carrier mobilities, etc.

As discussed in relation to FIGS. 4a, 4b and 5, carrier mobilities, doping concentrations, etc. of a layer of material which is used to form a constituent part of a device may have an influence on the operation of that device. For instance, variation in doping concentrations or carrier mobilities may affect the current flowing through a device, or the voltage across the device. For the same or similar reasons to those discussed above, it is often desirable to ensure that devices forming an array of devices operate consistently with respect to one another. If it is found that, for example, carrier mobility or doping concentration varies across the layer of material 410 shown in FIG. 6a, the shape or size of a constituent part of a device formed using that first layer 410 may need to have a desired shape or size to take account of that variation. Alternatively, it may be found that, for example, carrier mobility or doping concentrations are consistent within the first layer 410, but are different from a layer used to create a previous device. Similarly, the shape or size of a constituent part of a device formed using that first layer 410 may need to have a desired shape or size to take account of that variation. The shape or size is desired in that it results in, for example, an effect on the operation of the device, for example an improved operation of the device. For instance, when creating a TFT, a certain channel width may be desired such that the resultant TFT has a desired current flow.

Figure 6B:
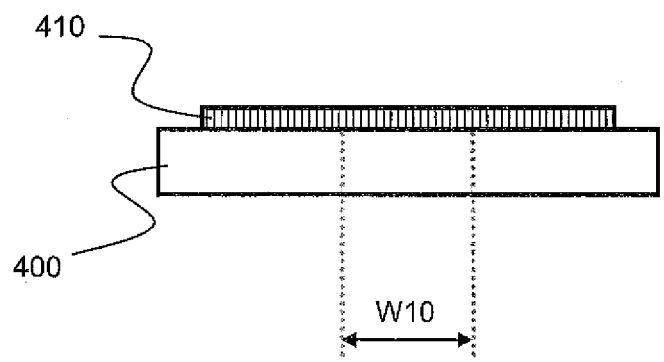

Referring to FIG. 6b, examination of, for example, the carrier mobility or doping concentration of the first layer 410 may be used to determine that a constituent part of a device to be formed in the first layer 410 needs to have a desired width W10. The width W10 may be desired in that the resultant device will allow or permit a certain current flow, for example. FIG. 6b schematically depicts this desired width W10 of the constituent part of a device to be formed in the first layer 410.

In standard photolithography where masks or reticles having fixed patterns are used, the implementation of a change in the size or shape (e.g. a width) of a particular constituent part of a device to be formed in a layer of material would be difficult, if not practically impossible. This is because any change in the desired shape or size of the constituent part of the device would need to be implemented by changing the pattern of a patterned radiation beam used to provide a pattern, related to that constituent part, on the substrate. A change in the pattern in the radiation beam would require the changing of a fixed pattern of the reticle or mask. Changing a fixed pattern of a reticle or mask, would, in general, require the creation of a new mask or reticle and this would usually be prohibitively expensive. This expense would increase even further if further alterations of the shape or size of one or more constituent parts of the device was required, since there would be an associated need for further alterations in the fixed patterns of the mask or reticles used to create these constituent parts.

A problem associated with the use of a fixed mask or reticle pattern can be overcome by using a plurality of individually controllable elements to create a pattern in a radiation beam, as described above. Rather than having to create or re-create a new mask or reticle with a different fixed pattern, according to an embodiment of the present invention the configuration of a plurality of individually controllable elements can be controlled (e.g. changed) to change the pattern created in the radiation beam. Such a change can be used to effect the desired change in the shape or size of a constituent part of a device that is to be created, for example, in a layer of material provided on the substrate and on which examination has been undertaken to determine a property of that layer. For example, the configuration of the plurality of the individually controllable elements may be changed by controlling the position and/or orientation and/or shape of one or more elements of the plurality (for example, the degree of tilt of the one or more elements), by changing the elements that contribute to the patterning of the radiation beam (for example, by selectively allowing or preventing one or more elements of the plurality from, for example, transmitting or reflecting radiation), by changing which elements of the plurality are arranged to emit radiation, or by controlling an optical property of one or more elements of the plurality of individually controllable elements.

Referring back to FIG. 6b, it was described that a constituent part of the device to be created in the first layer 410 should have a desired width W10. In order to achieve this desired width W10, an optimum configuration of a pattern in a patterned radiation beam can be determined which will result in the implementation of the desired size or shape of the constituent part of the device to be created in the first layer 410. A control arrangement of the lithographic apparatus may undertake such determination, as discussed above. The control arrangement may, alternatively or additionally, control the plurality of individually controllable elements to implement the determined configuration when creating the constituent part of the device in the first layer 410.

It will be understood that, in the creation of the constituent part of the device in the first layer 410, the first layer of material 410 may not be exposed to radiation directly. Instead, a layer of resist or other radiation-sensitive material may be provided on top of the first layer of material 410 in order to assist in the creation of one or more patterns (e.g. constituent parts of a device) in the first layer of material 410.

Figure 6C:
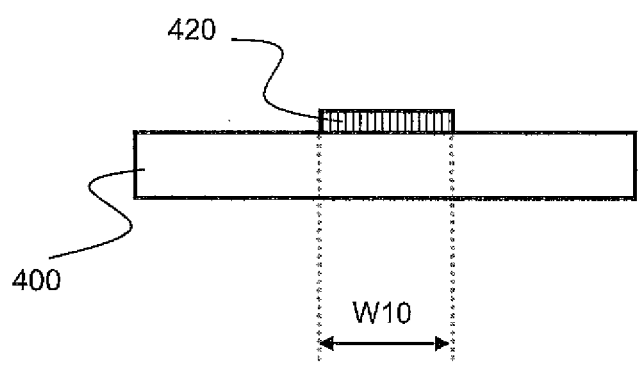

FIG. 6c shows that a constituent part of a device 420 has been created using the method described above. It can be seen that the constituent part of the device 420 has the desired width W10. In having the desired width W10, the constituent part of the device 420 will have an effect on a property or operation of the constituent part of the device 420, and/or an effect on a property or operation of the device as a whole. The effect may be an improved performance of the constituent part of the device 420 and/or of the device as a whole, and/or an increased efficiency of the constituent part of the device 420 and/or of the device as a whole, and/or an improved or increased functionality of the constituent part 420 of the device and/or of the device as a whole.

Figure 6D:
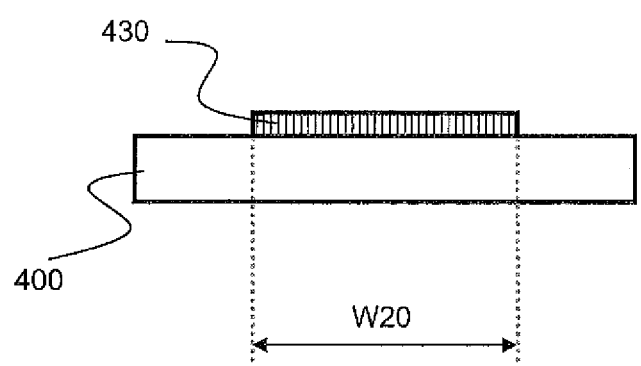

The examination process referred to above may be undertaken for any layer provided on the substrate, or on material already provided on that substrate, to determine whether the shape or size of a constituent part of a device to be created in that layer needs to have a desired shape or size. The desired shape or size may be no different from the shape or size of similar or identical constituent parts (e.g. of other devices), or the desired shape or size may be different from the shape or size of similar or identical constituent parts (e.g. of other devices). The desired shape or size may differ from device to device created on a substrate, or between devices created on different substrates. For instance, FIG. 6d shows that a constituent part 430 of another device has a greater width W20 than the desired width W10 shown in and described with reference to FIGS. 6b and 6c. This increased desired width W20 may be desired, for example, due to a variation in the carrier mobility or doping concentration or other properties of the layer in which the constituent part of the device 430 was created, or a variation between layers provided on different substrates (e.g. in the creation of multiple batches of devices on different substrates).

Figure 7:
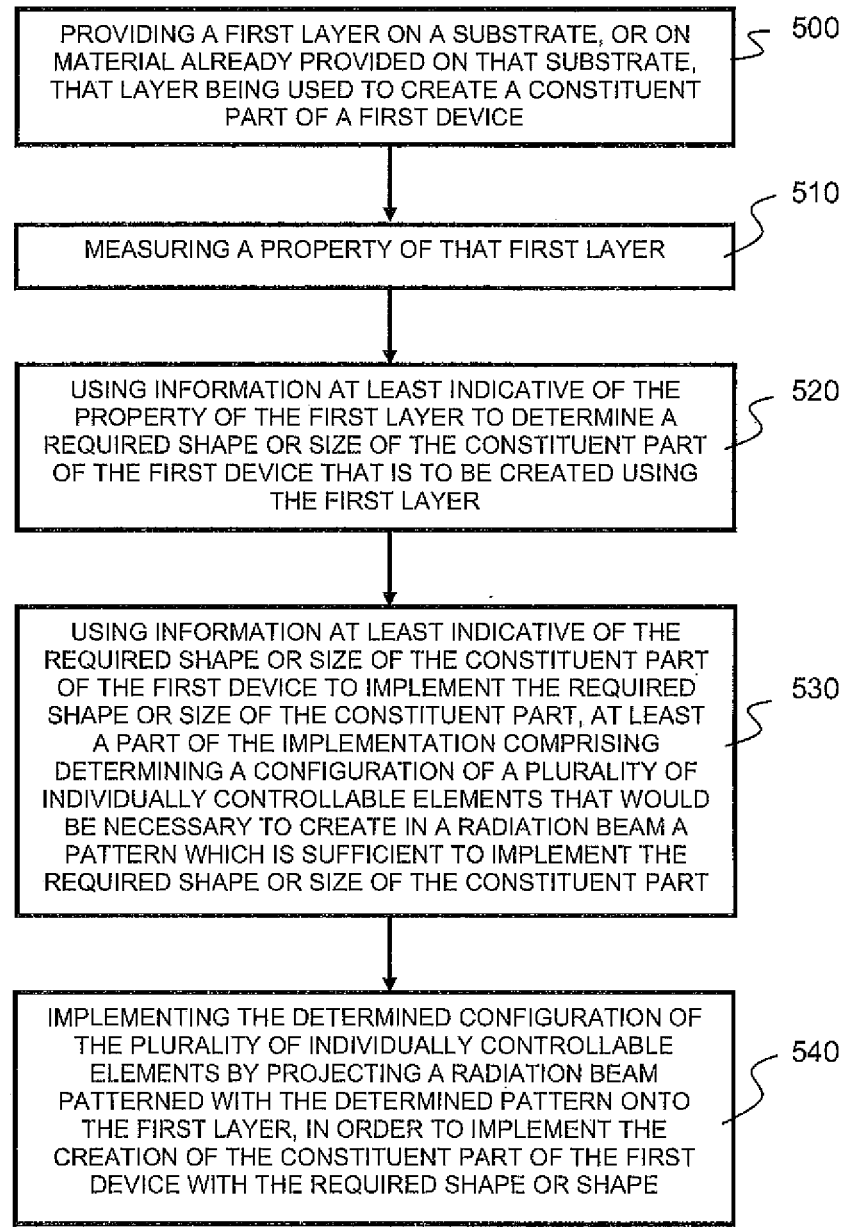
FIG. 7 is a flow chart schematically depicting, in general, an embodiment of the present invention.

FIG. 7 is a flow chart schematically depicting, in general terms, a method according to an embodiment of the present invention. The first stage 500 of the method comprises providing a layer of material on a substrate, or on material already provided on that substrate. That layer will subsequently be used to create a constituent part of a device. In other embodiments, the first stage 500 in the described method may not be required, since a layer may already have been provided on the substrate, or on material provided on that substrate.

In a second stage 510 of the method, a property of that first layer is measured. The property, and the way it is measured, may be undertaken as described above in relation to FIGS. 6a to 6d. In other embodiments the second stage 510 of the method may not need to be undertaken, for instance, if a property of the layer has already been measured (or determined).

In a third stage 520 of the method, information at least indicative of a property of the layer of material is used to determine a desired shape or size of a constituent part of the device that is to be created using that layer. The shape or size of the constituent part of the device has been described as 'desired'. The shape or size is desired in that the property of the device that has been measured has at least indicated (or it can be inferred or determined there from), that such a shape or size of the constituent part of the device will result in an effect (e.g. a desired effect) in the operation of the device, for example an improvement in its performance, efficiency or functionality. Again, this third stage 520 of the method may not be required if the desired shape or size of the constituent part of the device that is to be created in the layer of material is already known.

In a fourth stage 530 of the method, information at least indicative of the desired shape or size of the constituent part of the device is used to implement the desired shape or size of the constituent part of the device. The desired shape or size is, as discussed above, related to a measured property of a layer of material in which the constituent part of the device is to be created. This ensures that created devices function more uniformly, since their creation takes into account one or more measured properties of a layer in which one or more constituent parts of the device were formed. The desired shape or size may be a desired change in the shape or size. At least a part of the implementation comprises determining a configuration of a plurality of individually controllable elements that would be necessary to create in a radiation beam a pattern which is sufficient to implement the desired shape or size of the constituent part of the device. In other words, this part of the implementation involves determining the configuration, or change in a configuration, of the plurality of individually controllable elements that is necessary to put into effect (or in other words create) the desired size or shape of the constituent part of the device. For instance, the determination may involve the determination of which element or elements of the plurality of individually controllable elements need to be moved, re-oriented, turned on or off, etc., in order to effect the desired shape or size of the constituent part of the device. The fourth stage 530 of the method could be undertaken by a control arrangement of the lithographic apparatus, for example a computer of the like.

The fourth stage 530 of the method is advantageous in that it allows the use of information derived from one or more properties of a layer of material provided on the substrate to be fed back into the creation, or in other words fabrication, of a constituent part of a device using that layer. This part of the method is advantageous because the information is fed back into the control of a plurality of individually controllable elements. The configuration of the plurality of individually controllable elements can be easily and rapidly changed from one configuration to another with little or no associated costs. This is in stark contrast to known situations, whereby a patterning device with a fixed pattern may be required to implement the desired (e.g. desired change in) size or shape of a constituent part of a device. This is because it is difficult or impossible to quickly and cheaply create, for example, slightly different versions of a mask or reticle having a fixed pattern that would be necessary to implement the (one or more) desired shape or size of one or more of the constituent parts of a device.

A fifth stage 540 of the method comprises, in general, implementing the determined configuration of the plurality of individually controllable elements by projecting a radiation beam patterned with the determined pattern onto the first layer of material, in order to implement the desired shape or size of the constituent part of the device in that layer. It will be understood that, in the creation of the constituent part of the device in the layer, the layer of material may not be exposed to radiation directly. Instead, a layer of resist or other radiation-sensitive material may be provided on top of the layer of material in order to assist in the creation of one or more patterns (e.g. constituent parts of a device) in the layer of material 410, as is known in the art.

A sixth stage of the method, not shown in FIG. 7, may comprise repeating one, more or all stages of the method shown in FIG. 7. For instance, the method may be undertaken for one or more layers of material provided on a substrate in which one or more constituent parts of a device might be created.

Changes in the shape or size of one or more constituent parts of one or more devices to be created on the substrate may be undertaken "on-the-fly". For example, the shape or size of a constituent part of a device which is common to all devices created on a substrate may need to be varied across the substrate. Such variation may be required in order to take into account varying properties of the layer of material in which the constituent parts of the devices are to be created. It will be appreciated that the configuration of a pattern used to create a constituent part of a device may therefore change for one, more or all devices created on that substrate. Such a change is readily achievable by changing the configuration of a plurality of individually controllable elements that is used to pattern a radiation beam that is, in turn, used to create the constituent parts of the devices.

Embodiments of this particular aspect of the invention have been described in generic form. It will be understood, however, that the generic methods described may be implemented in a more specific form. For example, the generic methods described may be implemented in relation to, for example, the creation of devices shown in and described with reference to FIG. 4*a*, FIG. 4*b*, and FIG. 5. That is, an embodiment of the present invention may be used to implement a desired shape or size of a constituent part of, for example, a TFT, or a Schottky diodes or the like.

It will be understood that the embodiments described above can be combined. For example, the shape or size of a constituent part of a device can be chosen and implemented to take into account one or more properties of a layer of material in which the constituent part of the device is to be created. Alternatively or additionally, one or more properties of a partially or fully created device may be determined, and from that one or more desired changes in the shape or size of one or more constituent parts of that device may be determined. The desired change can be implemented in the subsequent creation of a similar or related device (e.g. a newer version of that device).

As described above, an embodiment of the present invention is not only applicable to the creation and variation in shape or size of a constituent part of a TFT or a Schottky diode. Instead an embodiment of the invention is applicable to the changing in shape or size of a constituent part of any device that may be fabricated using photolithography.

Although specific reference may be made in this text to the use of lithographic apparatus in the manufacture of a specific device (e.g. an integrated circuit or a flat panel display), it should be understood that the lithographic apparatus described herein may have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), etc. Also, for instance in a flat panel display, the present apparatus may be used to assist in the creation of a variety of layers, e.g. a thin film transistor layer and/or a color filter layer.

While specific embodiments of the invention have been described above, it will be appreciated that the invention may be practiced otherwise than as described. For example, an embodiment of the invention may take the form of a computer program containing one or more sequences of machine-readable instructions describing a method as disclosed above, or a data storage medium (e.g. semiconductor memory, magnetic or optical disk) having such a computer program stored therein.

Having described specific embodiments of the present invention, it will be understood that many modifications thereof will readily appear or may be suggested to those skilled in the art, and it is intended therefore that this invention is limited only by the spirit and scope of the following claims.

The invention claimed is:

1. A lithographic method, the method comprising:
using information at least indicative of a target shape or size of a constituent part of a device to implement the target shape or size of the constituent part of the device, the target shape or size being calculated from a measured materials property of a material of a layer in which the constituent part of the device is to be created and/or of a previous device, and at least a part of the implementation comprising determining a configuration of a plurality of individually controllable elements to create in a radiation beam a pattern which is sufficient to implement the target shape or size of the constituent part of the device when creating the constituent part of the device.

2. The method of claim 1, wherein,
before determining a configuration of a plurality of individually controllable elements to create in a radiation beam a pattern which is sufficient to implement the target shape or size of the constituent part of the device when creating the constituent part of the device,
and/or
before using information at least indicative of the measured property to determine the target shape or size of the constituent part of the device that is to be created using the layer of material,
the method further comprises:
measuring the property.

3. The method of claim 1, wherein after determining a configuration of a plurality of individually controllable elements to create in a radiation beam a pattern which is sufficient to implement the target shape or size of the constituent part of the device when creating the constituent part of the device, the method further comprises:
controlling the configuration of the plurality of individually controllable elements to implement the determined configuration.

4. The method of claim 3, wherein controlling the configuration of the plurality of individually controllable elements comprises:
controlling a position of one or more elements of the plurality of individually controllable elements, and/or
controlling an orientation of one or more elements of the plurality of individually controllable elements, and/or
controlling a shape of one or more elements of the plurality of individually controllable elements, and/or
controlling which of one or more elements of the plurality of individually controllable elements emit radiation, and/or
controlling an optical property of one or more elements of the plurality of individually controllable elements.

5. The method of claim 1, wherein the target shape or size of the constituent part of the device results in an effect in a property or operation of the constituent part of the device, and/or of the device as a whole.

6. The method of claim 5, wherein the effect is:
an improved performance of the constituent part of the device, and/or of the device as a whole, and/or
an increased efficiency of the constituent part of the device, and/or of the device as a whole, and/or
an improved or increased functionality of the constituent part of the device, and/or of the device as a whole.

7. The method of claim 1, wherein the target shape or size is calculated from a measured electrical or chemical property of a material of a layer in which the constituent part of the device is to be created.

8. A lithographic apparatus, comprising:
a plurality of individually controllable elements, configured to create a pattern in a radiation beam;
a projection system, configured to project the patterned radiation beam onto a substrate; and
a control arrangement, the control arrangement configured to use information at least indicative of a target shape or size of a constituent part of a device to implement the target shape or size of the constituent part of the device, the target shape or size being calculated from a measured materials property of a material of a layer in which the constituent part of the device is to be created and/or of a previous device, and at least a part of the implementation comprising determining a configuration of a plurality of individually controllable elements to create in a radiation beam a pattern which is sufficient to implement the target shape or size of the constituent part of the device when creating the constituent part of the device.

9. The apparatus of claim 8, wherein the plurality of individually controllable elements are micromirrors or laser diodes.

10. The apparatus of claim 8, wherein control arrangement is configured to calculate the target shape or size from a measured electrical or chemical property of a material of a layer in which the constituent part of the device is to be created.

11. A lithographic method, the method comprising:
using information at least indicative of a target change in the shape or size of a constituent part of a first device to implement the change in the shape or size of a constituent part of a subsequently created second device to vary the shape or size of that constituent part from the design shape or size of that constituent part such that the processed shape or size of the constituent part of the subsequently created second device is different from the design processed shape or size of that constituent part, at least a part of the implementation comprising determining a configuration of a plurality of individually controllable elements of a lithographic apparatus to create in a radiation beam a pattern which is sufficient to implement the change in the shape or size of the constituent part of the subsequently created second device.

12. The method of claim 11, wherein, before determining a configuration of the plurality of individually controllable elements of the lithographic apparatus to create in the radiation beam a pattern which is sufficient to implement the change in the shape or size of the constituent part of the subsequently created second device, the method further comprises:
using information at least indicative of a property of the first device to determine the target change in the shape or size of the constituent part of the first device that is to be implemented in the subsequently created second device.

13. The method of claim 11, wherein,
before determining a configuration of the plurality of individually controllable elements of the lithographic apparatus to create in the radiation beam a pattern which is sufficient to implement the change in the shape or size of the constituent part of the subsequently created second device,
and/or
before using information at least indicative of a property of the first device to determine the target change in the shape or size of the constituent part of the first device that is to be implemented in the subsequently created second device,
the method further comprises:
measuring the property of the first device.

14. The method of claim 11, wherein after determining the configuration of the plurality of individually controllable elements of the lithographic apparatus to create in the radiation beam a pattern which is sufficient to implement the change in the shape or size of the constituent part of the subsequently created second device, the method further comprises
controlling the configuration of the plurality of individually controllable elements to implement the determined configuration.

15. The method of claim 11, wherein the change in shape or size of the constituent part of the subsequently created second device results in an effect in a property or operation of the constituent part of the subsequently created second device, and/or of the second device as a whole.

16. The method of claim 11, wherein the first and subsequently created second devices are different versions of the same general device.

17. A lithographic apparatus, the lithographic apparatus comprising
a plurality of individually controllable elements, configured to create a pattern in a radiation beam;
a projection system, configured to project the patterned radiation beam onto a substrate; and
a control arrangement, the control arrangement being configured to use information at least indicative of a target change in the shape or size of a constituent part of a first device to implement the change in the shape or size of a constituent part of a subsequently created second device to vary the shape or size of that constituent part from the design shape or size of that constituent part such that the processed shape or size of the constituent part of the subsequently created second device is different from the design processed shape or size of that constituent part, at least a part of the implementation comprising determining a configuration of the plurality of individually controllable elements to create in the radiation beam a pattern which is sufficient to implement the target change in the shape or size of the constituent part of the subsequently created second device.

18. The apparatus of claim 17, wherein the plurality of individually controllable elements are micromirrors or laser diodes.

19. A lithographic apparatus, comprising:
a plurality of individually controllable elements, configured to create a pattern in a radiation beam;
a projection system, configured to project the patterned radiation beam onto a substrate; and
a control arrangement, the control arrangement configured to use information at least indicative of a target shape or size of a constituent part of a device to implement the target shape or size of the constituent part of the device, the target shape or size being calculated using a measured electrical or chemical property of a material of a layer in which the constituent part of the device is to be created and/or a measured electrical or chemical property of a material of a previous device, and at least a part of the implementation comprising determining a configuration of a plurality of individually controllable elements to create in a radiation beam a pattern which is sufficient to implement the target shape or size of the constituent part of the device when creating the constituent part of the device.

20. The apparatus of claim 19, wherein the measured electrical or chemical property comprises a doping concentration and/or carrier mobility.

* * * * *

UNITED STATES PATENT AND TRADEMARK OFFICE
CERTIFICATE OF CORRECTION

| | | |
|---|---|---|
| PATENT NO. | : 8,982,318 B2 | Page 1 of 1 |
| APPLICATION NO. | : 12/566073 | |
| DATED | : March 17, 2015 | |
| INVENTOR(S) | : Nikolay Nikolaevich Iosad et al. | |

It is certified that error appears in the above-identified patent and that said Letters Patent is hereby corrected as shown below:

On Title Page 2, Item (56), References Cited, Column 2, OTHER PUBLICATIONS
after the last reference, insert --Taiwan Decision dated Aug. 22, 2013 in corresponding Taiwan Patent Application No. 098129741.--.

Signed and Sealed this
Twenty-first Day of July, 2015

Michelle K. Lee
*Director of the United States Patent and Trademark Office*